(12) United States Patent
Myung et al.

(10) Patent No.: US 9,159,688 B2
(45) Date of Patent: Oct. 13, 2015

(54) SEMICONDUCTOR DEVICE INCLUDING A SOLDER AND METHOD OF FABRICATING THE SAME

(71) Applicant: Samsung Electronics Co., Ltd., Suwon-Si, Gyeonggi-Do (KR)

(72) Inventors: Jong Yun Myung, Seoul (KR); Yonghwan Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/170,809

(22) Filed: Feb. 3, 2014

(65) Prior Publication Data

US 2014/0217580 A1    Aug. 7, 2014

(30) Foreign Application Priority Data

Feb. 5, 2013    (KR) .................. 10-2013-0013037

(51) Int. Cl.
*H01L 23/00*    (2006.01)
*H01L 23/31*    (2006.01)

(52) U.S. Cl.
CPC ............ *H01L 24/13* (2013.01); *H01L 23/3128* (2013.01); *H01L 24/11* (2013.01); *H01L 24/16* (2013.01); *H01L 24/81* (2013.01); *H01L 24/03* (2013.01); *H01L 24/05* (2013.01); *H01L 2224/03912* (2013.01); *H01L 2224/0401* (2013.01); *H01L 2224/05166* (2013.01); *H01L 2224/05647* (2013.01); *H01L 2224/119* (2013.01); *H01L 2224/1146* (2013.01); *H01L 2224/1147* (2013.01); *H01L 2224/11825* (2013.01); *H01L 2224/11849* (2013.01); *H01L 2224/11906* (2013.01); *H01L 2224/131* (2013.01); *H01L 2224/13017* (2013.01); *H01L 2224/13082* (2013.01); *H01L 2224/13111* (2013.01); *H01L 2224/13116* (2013.01); *H01L 2224/13139* (2013.01); *H01L 2224/13147* (2013.01); *H01L 2224/13562* (2013.01); *H01L 2224/13564* (2013.01); *H01L 2224/13655* (2013.01); *H01L 2224/1601* (2013.01); *H01L 2224/16058* (2013.01); *H01L 2224/16227* (2013.01); *H01L 2224/73204* (2013.01); *H01L 2224/81011* (2013.01); *H01L 2224/81193* (2013.01); *H01L 2224/81815* (2013.01);
(Continued)

(58) Field of Classification Search
CPC .......... H01L 24/13; H01L 24/16; H01L 14/13
See application file for complete search history.

(56) References Cited

U.S. PATENT DOCUMENTS 6,413,851 B1 *   7/2002   Chow et al. ................ 438/613
7,135,770 B2    11/2006   Nishiyama et al.
(Continued)

FOREIGN PATENT DOCUMENTS

JP    2011-044563 A    3/2011
KR    10-1073485 B1    9/2010
KR    2011-0026619 A   3/2011

*Primary Examiner* — William Coleman
(74) *Attorney, Agent, or Firm* — Harness, Dickey & Pierce, P.L.C.

(57) ABSTRACT

A semiconductor device includes a bonding pad on a semiconductor substrate, a bump on the bonding pad, a solder on the bump, and an anti-wetting layer between the bump and the solder extending along a sidewall of the bump, the anti-wetting layer having a first thickness T1 along the sidewall of the bump closer to the solder and a second thickness T2 along the sidewall of the bump closer to the bonding pad, wherein T2<T1.

23 Claims, 13 Drawing Sheets

(52) U.S. Cl.
CPC ............... *H01L2224/81907* (2013.01); *H01L 2924/15311* (2013.01)

(56) References Cited

U.S. PATENT DOCUMENTS

| | | | |
|---|---|---|---|
| 7,382,049 B2 * | 6/2008 | Ho et al. | ............ 257/737 |
| 7,919,406 B2 | 4/2011 | Tseng et al. | |
| 8,232,193 B2 | 7/2012 | Chang | |
| 8,242,011 B2 | 8/2012 | Lim et al. | |
| 2003/0151140 A1 | 8/2003 | Nishiyama et al. | |
| 2010/0132998 A1 | 6/2010 | Lee et al. | |
| 2011/0006416 A1 | 1/2011 | Tseng et al. | |
| 2011/0101523 A1 * | 5/2011 | Hwang et al. | ............ 257/737 |
| 2011/0298123 A1 | 12/2011 | Hwang et al. | |
| 2011/0304042 A1 | 12/2011 | Lin et al. | |
| 2012/0007231 A1 | 1/2012 | Chang | |
| 2012/0074578 A1 | 3/2012 | Kobayashi et al. | |
| 2012/0091577 A1 | 4/2012 | Hwang et al. | |
| 2012/0092577 A1 * | 4/2012 | Shi et al. | ............ 349/43 |
| 2012/0178251 A1 | 7/2012 | Lim et al. | |

* cited by examiner

SEMICONDUCTOR DEVICE INCLUDING A SOLDER AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0013037, filed on Feb. 5, 2013, in the Korean Intellectual Property Office, the entire contents of which are hereby incorporated by reference.

BACKGROUND

1. Field

Some example embodiments of the inventive concepts relate to a semiconductor device and/or a method of fabricating the same.

2. Description of the Related Art

As a consequence of the use of high-density semiconductor chips in electronic devices, there is an increasing demand for a technology capable of realizing a semiconductor chip with many pins and a relatively small pitch. For example, wire and flip-chip bonding technologies may be used to mount a semiconductor chip on a package substrate. In the wire bonding technology, gold wires are used to connect bonding pads of the semiconductor chip to conductive patterns of the package substrate. However, the use of the gold results in an increase in cost of the electronic device and a wire sweeping problem. In flip-chip bonding technology, it is possible to improve a signal delivery speed.

SUMMARY

Some example embodiments of the inventive concepts provide a semiconductor device configured to prevent or inhibit an electric short circuit from occurring between solders.

Other example embodiments of the inventive concepts provide a fabricating method configured to perform a solder joint control with ease.

According to an example embodiment of the inventive concepts, a semiconductor device includes a bonding pad on a semiconductor substrate, a bump on the bonding pad, a solder on the bump, and an anti-wetting layer between the bump and the solder extending along a sidewall of the bump. The anti-wetting layer has a first thickness T1 along the sidewall of the bump closer to the solder and a second thickness T2 along the sidewall of the bump closer to the bonding pad, wherein T2<T1.

In an example embodiment, an angle between a surface of the bump facing the solder and the sidewall of the bump may be about 85-95°.

In an example embodiment, the anti-wetting layer covers at least ⅓ of the sidewall of the bump.

In an example embodiment, the solder may be spaced apart from a sidewall of the anti-wetting layer.

In an example embodiment, the anti-wetting layer may include nickel.

In an example embodiment, wettability between the anti-wetting layer and the solder may be lower than that between the bump and the solder.

In an example embodiment, the device may further include a semiconductor chip including the semiconductor substrate, a package substrate facing the semiconductor chip, and a conductive pattern on the package substrate and in contact with the solder.

In an example embodiment, the device may further include a seed layer between the bump and the bonding pad. The anti-wetting layer may be spaced apart from a sidewall of the seed layer.

According to another example embodiment of the inventive concepts, a method of fabricating a semiconductor device includes forming a seed layer on a semiconductor substrate, forming a photoresist pattern including an opening exposing a portion of the seed layer, forming a bump to fill a portion of the opening and be in contact with the seed layer, partially removing the photoresist pattern to expose at least a portion of a sidewall of the bump, forming an anti-wetting layer to cover a top surface of the bump and the exposed portion of the sidewall of the bump, and forming a first solder to be in contact with a top surface of the anti-wetting layer.

In another example embodiment, the photoresist pattern may be partially removed by a descum process.

In another example embodiment, the descum process may be performed using nitrogen plasma.

In another example embodiment, the descum process may partially remove the photoresist pattern without etching the bump.

In another example embodiment, the method may further include removing the photoresist pattern, removing a portion of the seed layer not covered by the bump, and reflowing the first solder to transform the first solder into a spherical shape.

In another example embodiment, the method may further include providing a flux agent on a bottom surface of the first solder, providing a package substrate including a conductive pattern on a top surface thereof, and a second solder in contact with the conductive pattern and the first solder, and welding the first and second solders together.

According to yet another example embodiment, a semiconductor device includes an anti-wetting layer between a surface of a bump facing a solder and extending along a sidewall of the bump, the solder being spaced apart from a sidewall of the anti-wetting layer.

In yet another example embodiment, the anti-wetting layer may have a first thickness T1 along the sidewall of the bump closer to the solder and a second thickness T2 along the sidewall of the bump further from the solder, wherein T2<T1.

In yet another example embodiment, an angle between the surface of the bump facing the solder and the sidewall of the bump may be about 85-95°.

In yet another example embodiment, the anti-wetting layer may cover at least ⅓ of the sidewall of the bump.

In yet another example embodiment, the anti-wetting layer may include nickel.

In yet another example embodiment, the solder may include at least one of silver, tin and lead.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
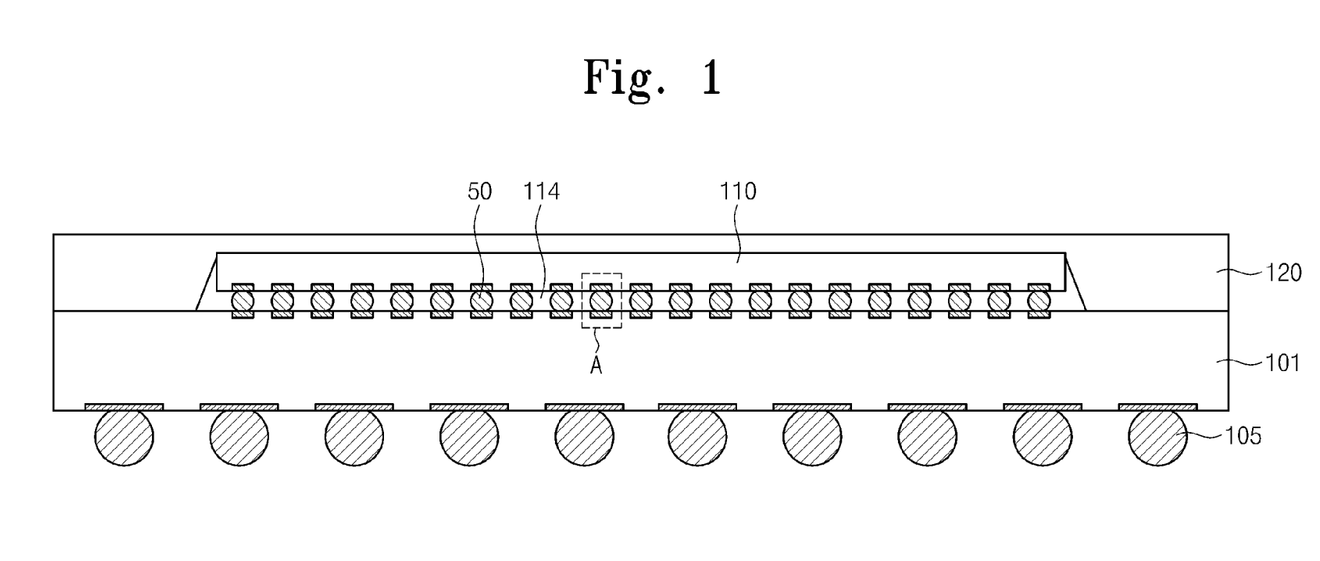
FIG. 1 is a sectional view of a semiconductor device according to an example embodiment of the inventive concepts.

FIG. 1 is a sectional view of a semiconductor device according to an example embodiment of the inventive concepts.

Referring to FIG. 1, in a semiconductor device according to an example embodiment of the inventive concepts, a semiconductor chip 110 may be mounted, in a flip-chip bonding manner, on a package substrate 101 using internal solders 50. An underfill resin layer 114 may be provided to fill a gap region between the internal solders 50. The semiconductor chip 110 and the package substrate 101 may be covered with a mold layer 120. An outer solder 105 may be attached on a bottom surface of the package substrate 101.

Figure 2:
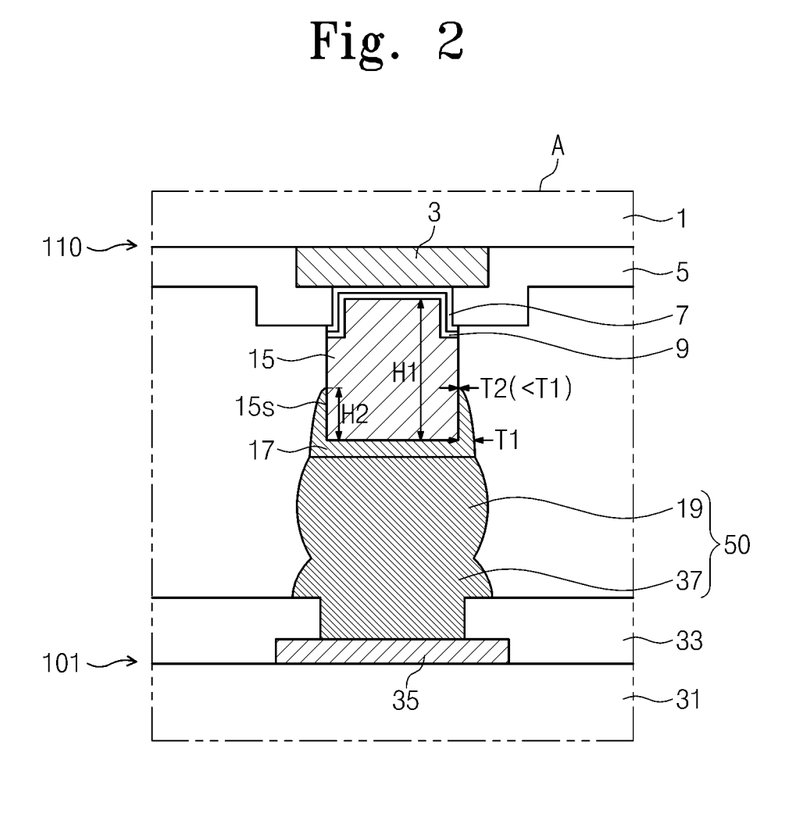
FIG. 2 is an enlarged sectional view of a portion A of FIG. 1, according to an example embodiment of the inventive concepts.

FIG. 2 is an enlarged sectional view of a portion A of FIG. 1, according to an example embodiment of the inventive concepts.

Referring to FIG. 2, a bonding pad 3 may be provided on a bottom surface of a semiconductor substrate 1 of the semiconductor chip 110. Although not shown, insulating layers (such as a plurality of interlayered dielectric layers or an etch stop layer) and wiring lines may be provided between the semiconductor substrate 1 and the bonding pad 3. The bonding pad 3 may be provided on the uppermost one of the interlayered dielectric layers. The bonding pad 3 may be formed of a conductive layer (e.g., of aluminum). A passivation layer 5 may be provided to cover partially the semiconductor substrate 1 and the bonding pad 3. The passivation layer 5 may include at least one of a silicon nitride layer or a polyimide layer. A diffusion barrier layer 7 may be provided to be in contact with the bonding pad 3. The diffusion barrier layer 7 may be formed of, for example, titanium. A seed layer 9 may be provided on the diffusion barrier layer 7. The seed layer 9 may be formed of, for example, copper. A bump 15 may be provided on the seed layer 9. The bump 15 may be formed of, for example, copper. The bump 15 may have a corner with an almost right angle of about 85-95°.

An anti-wetting layer 17 may be provided to cover a surface of the bump 15 facing the package substrate 101 and a portion of a sidewall of the bump 15. The anti-wetting layer 17 may be formed of, for example, nickel. A side surface 15s of the bump 15 in contact with the anti-wetting layer 17 may have a thickness H2 that is equivalent to or greater than about ⅓ of a total thickness H1 of the bump 15. A first solder 19 may be provided to be in contact with the anti-wetting layer 17. The first solder 19 may include at least one of silver, tin, or lead. A thickness T2 of the anti-wetting layer 17 adjacent to the bonding pad 3 may be smaller than a thickness T1 of the anti-wetting layer 17 adjacent to the first solder 19. Wettability between the anti-wetting layer 17 and the first solder 19 may be lower than that between the bump 15 and the first solder 19.

Accordingly, during a solder reflow process, the first solder 19 may not be in contact with a side surface of the anti-wetting layer 17. Accordingly, an electric short problem between solders can be solved.

In the package substrate 101, a conductive pattern 35 may be provided on an insulating substrate 31, and a solder resist layer 33 may be provided to cover partially the insulating substrate 31 and the conductive pattern 35. The conductive pattern 35 may be in contact with a second solder 37. The first solder 19 and the second solder 37 may be heated and welded to form each internal solder 50. The second solder 37 and the internal solder 50 may include at least one of silver, tin, or lead.

FIGS. 3 through 13 are sectional views illustrating a process of fabricating a semiconductor device, whose section is shaped like FIG. 2.

Figure 3:
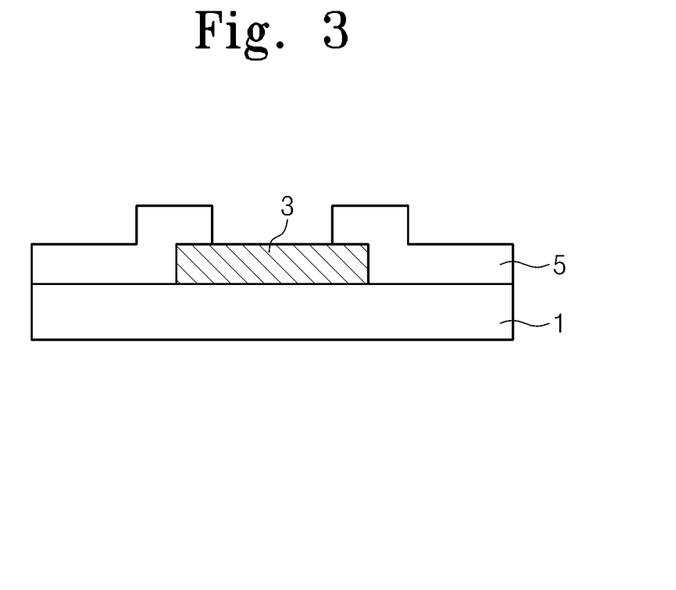
FIGS. 3 through 13 are sectional views illustrating a process of fabricating a semiconductor device, whose section is shaped like FIG. 2.

Referring to FIG. 3, a bonding pad 3 may be formed over a semiconductor substrate 1. Although not shown, a plurality of transistors, a plurality of interlayered dielectric layers, an etch stop layer, and wiring lines may be provided on the semiconductor substrate 1. The bonding pad 3 may be provided on the uppermost one of the interlayered dielectric layers. The bonding pad 3 may be formed of a conductive layer (e.g., aluminum). A passivation layer 5 may be formed to cover partially the semiconductor substrate 1 and the bonding pad 3. The passivation layer 5 may include at least one of a silicon nitride layer or a polyimide layer.

Figure 4:
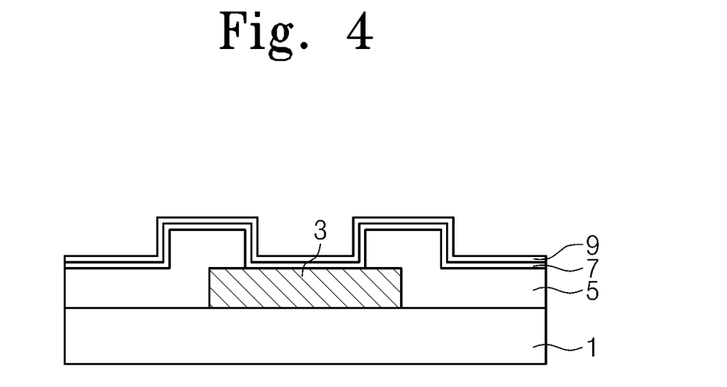

Referring to FIG. 4, a diffusion barrier layer 7 and a seed layer 9 may be conformally formed on the semiconductor substrate 1. In example embodiments, the diffusion barrier layer 7 may be formed of titanium. The seed layer 9 may be formed of copper.

Figure 5:
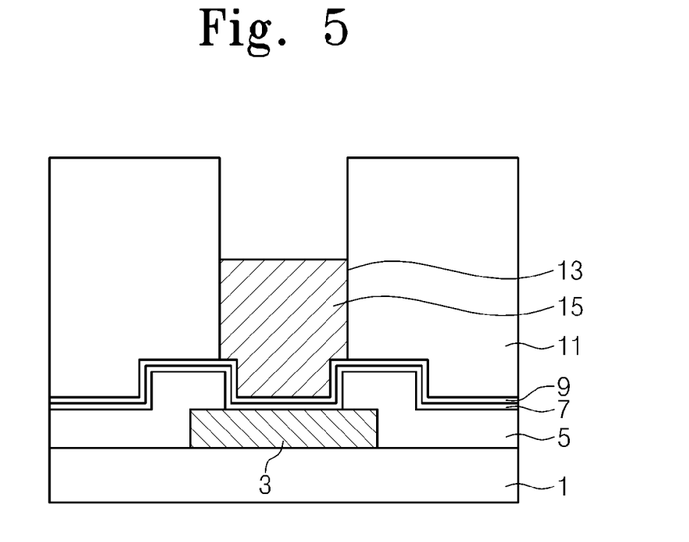

Referring to FIG. 5, a photolithography process may be performed to form a photoresist pattern 11 on the seed layer 9. The photoresist pattern 11 may be formed to have an opening 13 that is overlapped with the bonding pad 9. A plating process may be performed to form a bump 15 on the seed layer 9 exposed by the opening 13. The bump 15 may be formed of copper. The bump 15 may be formed to fill a portion of the opening 13.

Figure 6:
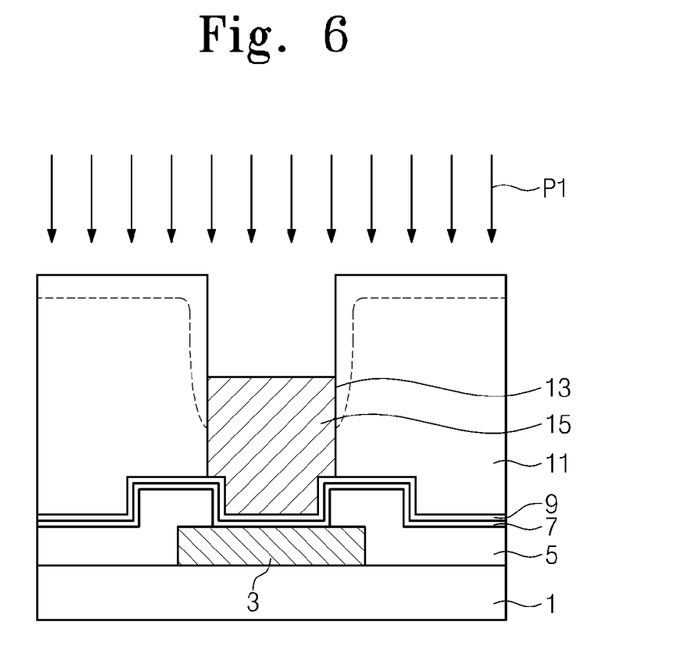
Figure 7:
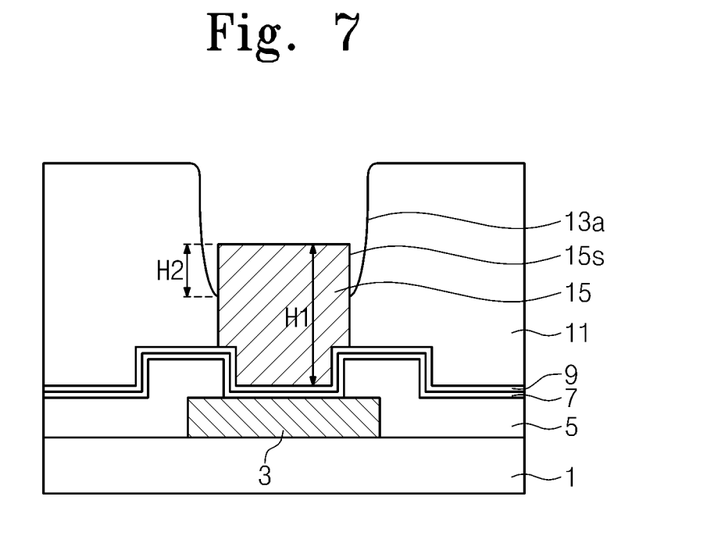

Referring to FIGS. 6 and 7, a descum process P1 may be performed to remove a portion of the photoresist pattern 11. In example embodiments, a sidewall 15s of the bump 15 may be partially exposed after the descum process P1. The descum process P1 may be performed using nitrogen plasma. Top and side surfaces of the photoresist pattern 11 may be etched, thereby partially exposing the sidewall 15s of the bump 15. An opening 13a may have an increased width, compared with the initial opening 13, and the bump 15 may not be etched. Accordingly, a corner of the bump 15 may maintain its initial shape having an almost right angle of about 85-95°. A sidewall 15s of the bump 15 exposed by the descum process P1 may have a thickness H2 that is equivalent to or greater than about ⅓ of a total thickness H1 of the bump 15. Nitrogen plasma is difficult to permeate to a lower portion of a gap space between the bump 15 and the opening 13a, and thus, a gap space may be tapered downward.

Figure 8:
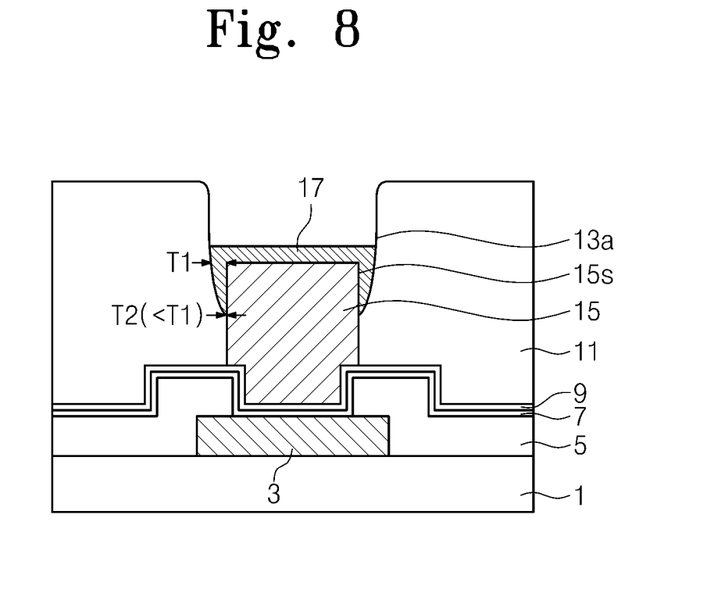

Referring to FIG. 8, a plating process may be performed to form an anti-wetting layer 17 that covers the top surface and the sidewall 15s of the bump 15 exposed by the opening 13a. The anti-wetting layer 17 may be formed of, for example, nickel. The anti-wetting layer 17 may be formed to have a lower thickness T2 that is smaller than an upper thickness T1.

Figure 9:
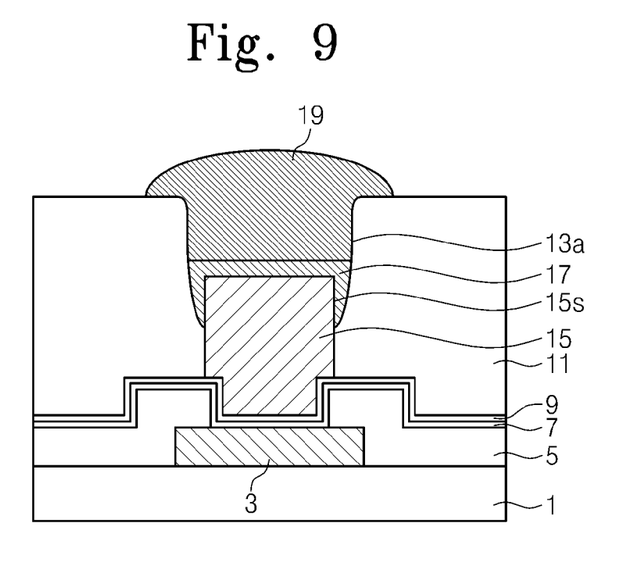

Referring to FIG. 9, a plating process may be performed to form a first solder 19 filling the opening 13a. The first solder 19 may include at least one of silver, tin, or lead.

Figure 10:
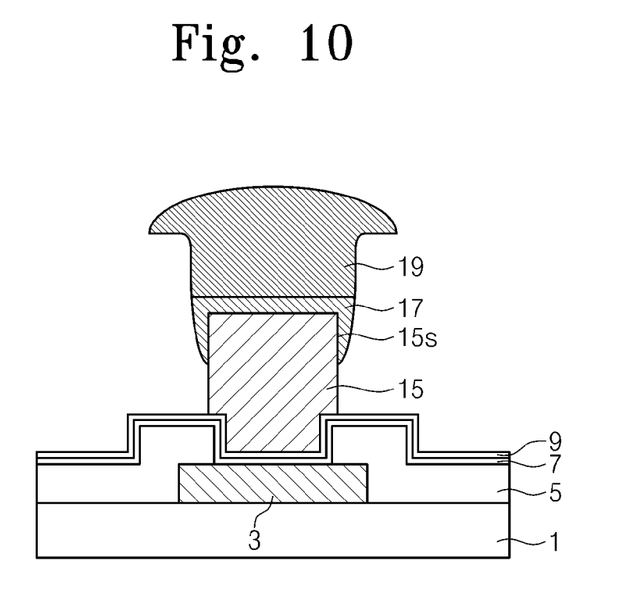

Referring to FIG. 10, the photoresist pattern 11 may be selectively removed. The removal of the photoresist pattern 11 may be performed using a wet etching process. As a result, the anti-wetting layer 17, the bump 15, and the seed layer 9 may be exposed.

Figure 11:
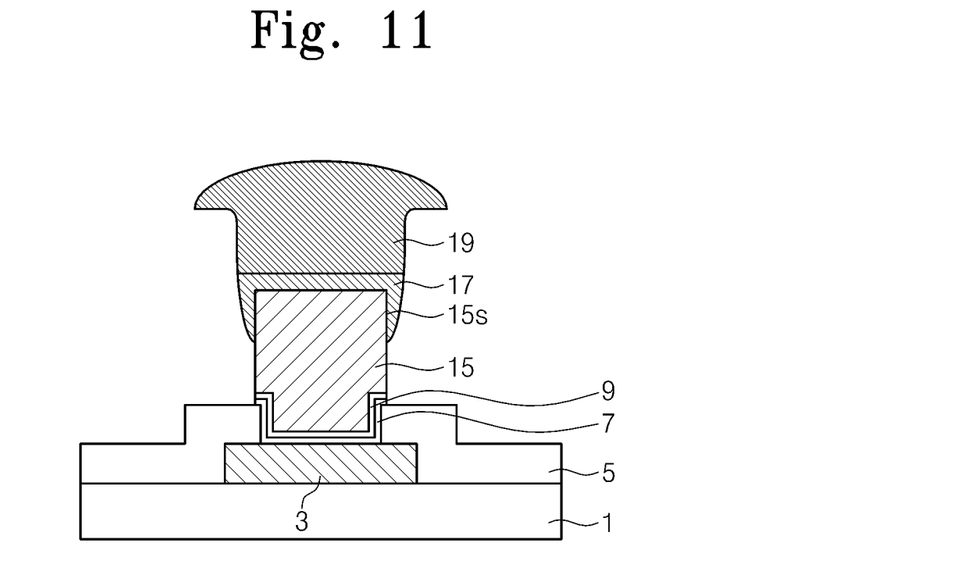

Referring to FIG. 11, the exposed portion of the seed layer 9 and a portion of the diffusion barrier layer 7 thereunder may be selectively removed to expose the passivation layer 5.

Figure 12:
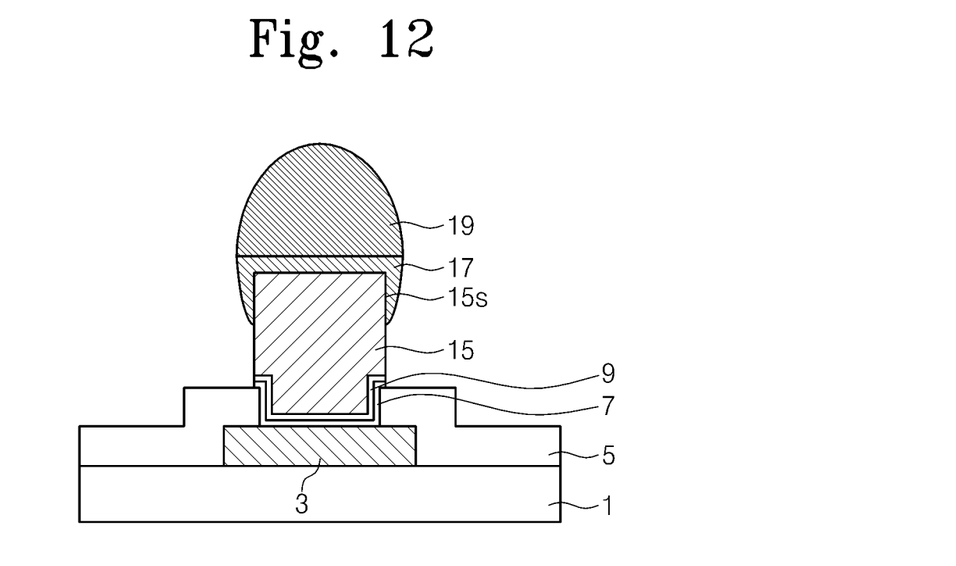

Referring to FIG. 12, a solder reflow process may be performed in such a way that the first solder 19 is transformed to a spherical shape.

Figure 13:
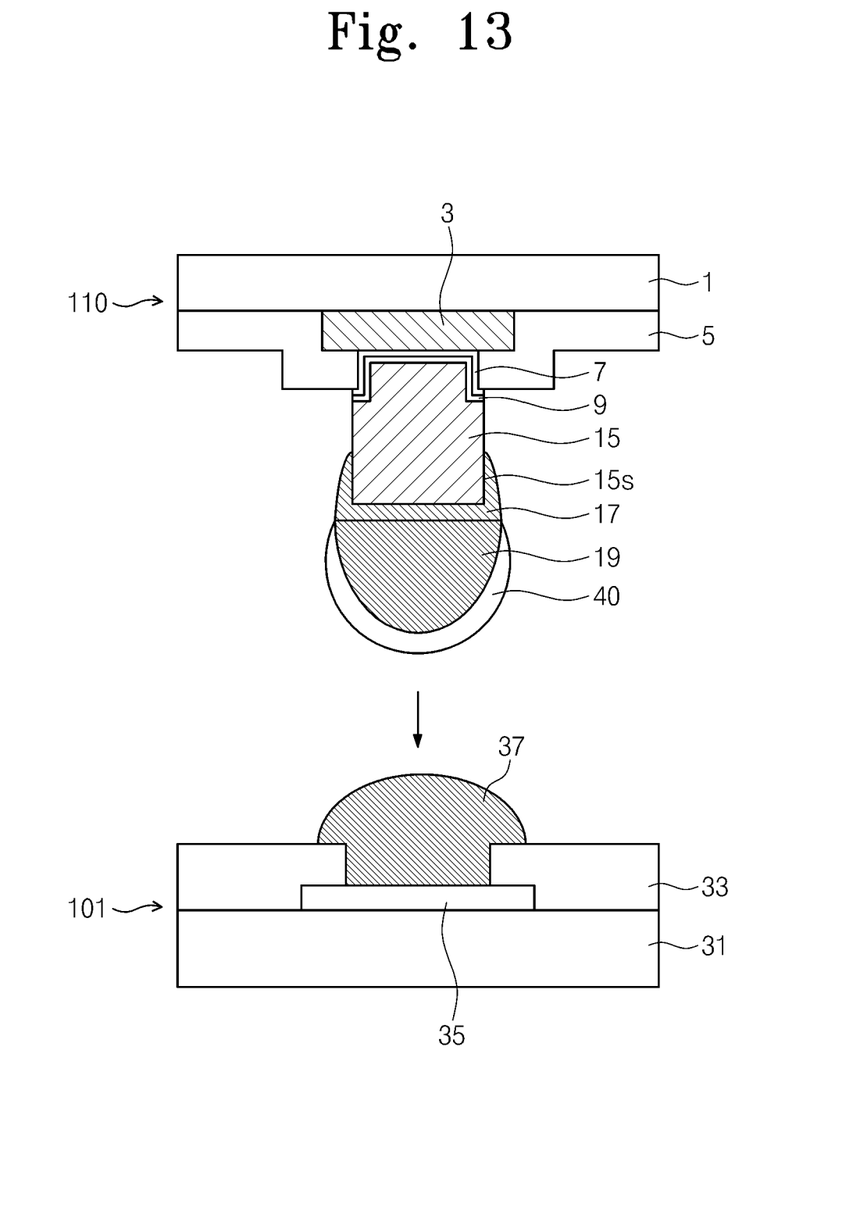

Referring to FIGS. 13 and 2, provided is a package substrate 101 including an insulating substrate 31, a conductive pattern 35, a solder resist layer 33, and a second solder 37. The semiconductor chip 110 may be disposed on the package substrate 101. A flux agent 40 may be provided on a bottom surface of the first solder 19, and the first solder 19 may be moved to be in contact with the second solder 37. Thereafter, the first solder 19 and the second solder 37 may be heated and welded to form an internal solder 50.

Figure 14:
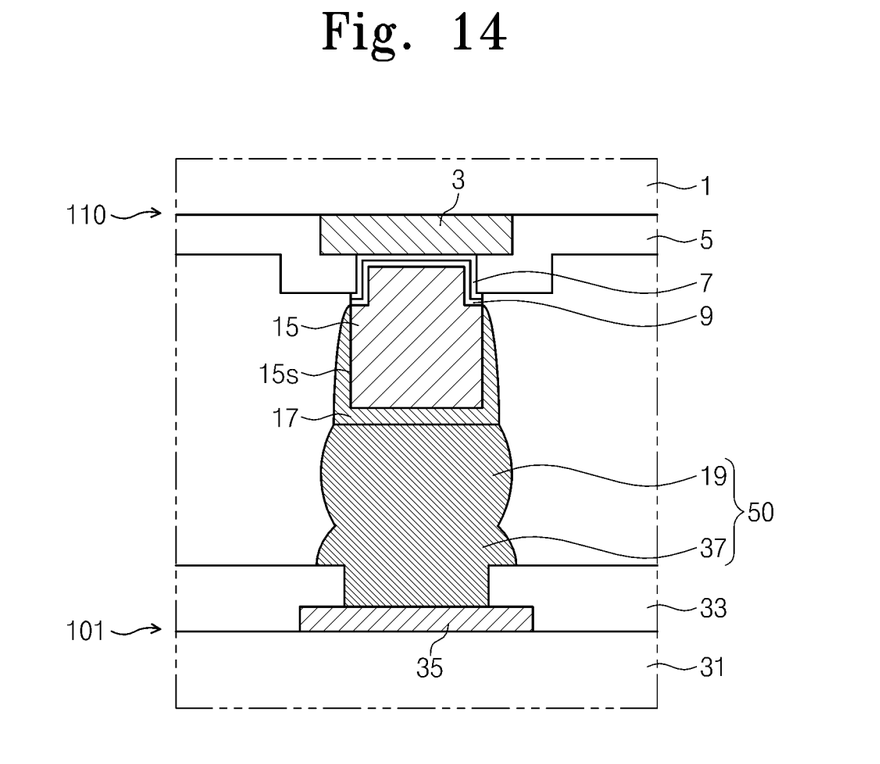
FIG. 14 is an enlarged sectional view of a portion A of FIG. 1, according to another example embodiment of the inventive concepts.

FIG. 14 is an enlarged sectional view of a portion A of FIG. 1, according to another example embodiment of the inventive concepts.

Referring to FIG. 14, in a semiconductor device according to the present embodiments, the anti-wetting layer 17 may be provided to cover wholly the sidewall 15s of the bump 15. However, the anti-wetting layer 17 may be spaced apart from sidewalls of the seed layer 9 and the diffusion barrier layer 7. Except for this difference, the device of FIG. 14 may be configured to have substantially the same structure as that of FIG. 2.

Figure 15:
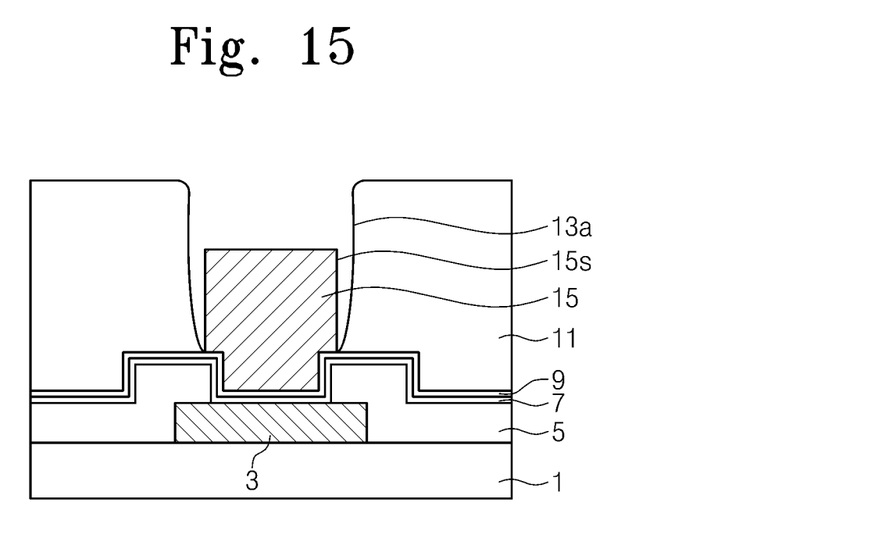
FIG. 15 is a sectional view illustrating a process of fabricating a semiconductor device, whose section is shaped like FIG. 14.

FIG. 15 is a sectional view illustrating a process of fabricating a semiconductor device, whose section is shaped like FIG. 14.

Referring to FIG. 15, a descum process may be performed to the structure of FIG. 5 to remove a portion of the photoresist pattern 11 and expose the sidewall 15s of the bump 15. Here, the sidewall 15s of the bump 15 may be wholly exposed, unlike FIG. 7. Thereafter, the subsequent process may be performed in the same manner as that described with reference to FIGS. 8 through 13.

The afore-described semiconductor package techniques may be applied to realize various semiconductor devices and/or various package modules with the semiconductor device.

Figure 16:
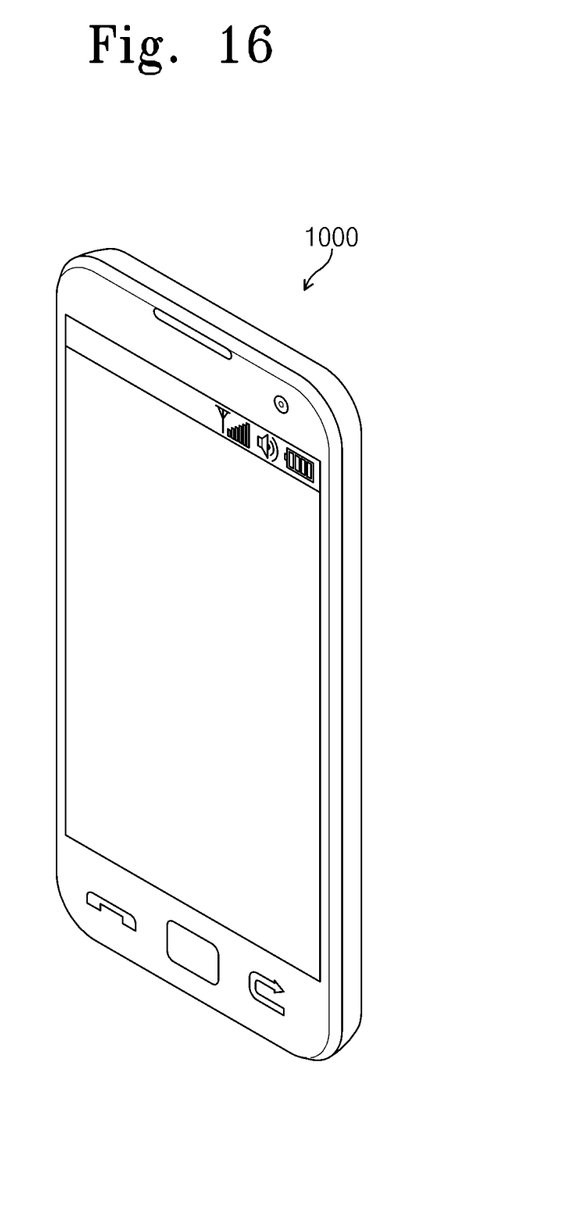
FIG. 16 is a perspective view illustrating an electronic system including at least one of semiconductor packages according to various example embodiments of the inventive concepts.

FIG. 16 is a perspective view illustrating an electronic system including at least one of semiconductor packages according to various example embodiments of the inventive concepts.

Referring to FIG. 16, semiconductor packages according to the various embodiments of the inventive concepts may be applicable to an electronic system 1000, for example, a smart phone. The semiconductor packages according to the example embodiments of the inventive concepts may have the advantages which are capable of being scaling down and/or realizing improved performance. The electronic system including the semiconductor packages according to the embodiments is not limited to the smart phone. For example, the semiconductor packages according to the embodiments may be applicable to a mobile electronic product, a laptop computer, a portable computer, a portable multimedia player (PMP), an MP3 player, a camcorder, a web tablet, a wireless phone, a navigator or a personal digital assistant (PDA).

Figure 17:
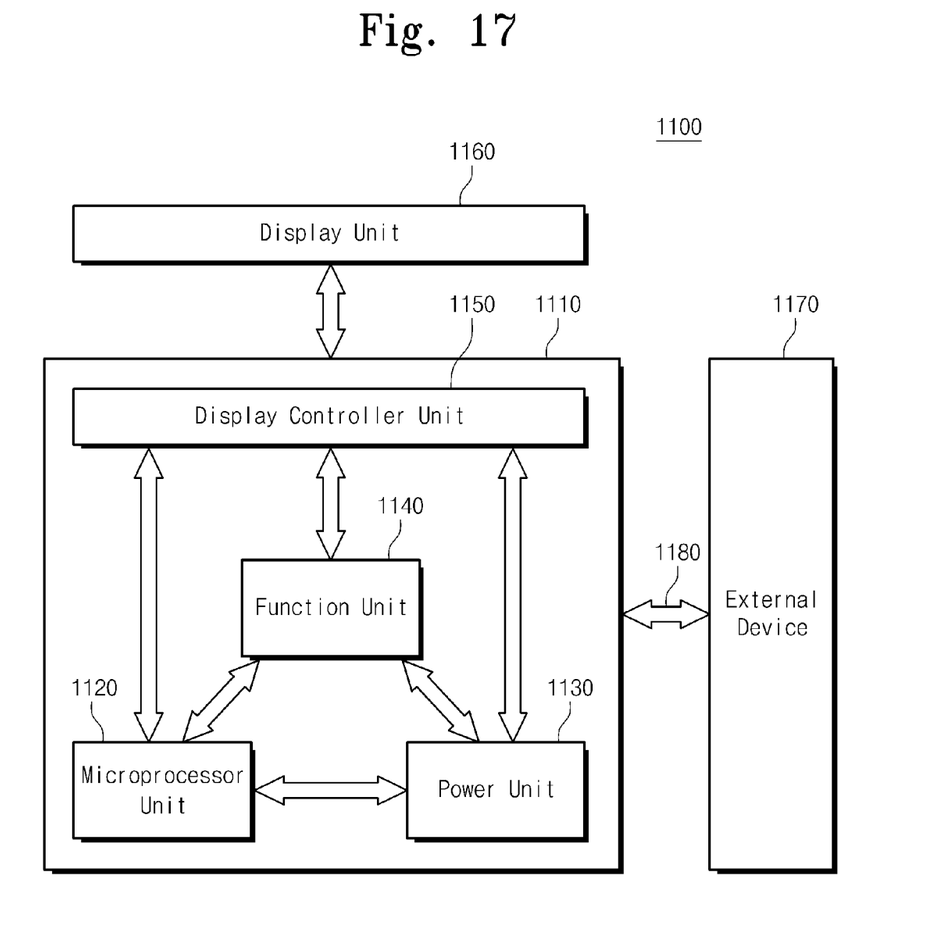
FIG. 17 is a schematic block diagram illustrating an electronic system including at least one of semiconductor packages according to various example embodiments of the inventive concepts.

FIG. 17 is a schematic block diagram illustrating an electronic system including at least one of semiconductor packages according to various example embodiments of the inventive concepts.

Referring to FIG. 17, the semiconductor package 101-106 described above may be applicable to an electronic system 1100. The electronic system 1100 may include a body 1110, a microprocessor unit 1120, a power unit 1130, a function unit 1140 and a display controller unit 1150. The body 1110 may include a set board formed of a printed circuit board (PCB), and the microprocessor unit 1120, the power unit 1130, the function unit 1140 and the display controller unit 1150 may be mounted on and/or in the body 1110.

The power unit 1130 may receive an electric power having a certain voltage from an external battery (not shown) and may generate a plurality of output power signals having different voltages, and the output power signals may be supplied to the microprocessor unit 1120, the function unit 1140 and the display control unit 1150.

The microprocessor unit 1120 may receive one of the output power signals from the power unit 1130 to control the function unit 1140 and the display unit 1160. The function unit 1140 may operate so that the electronic system 1100 executes one of diverse functions. For example, in the event that the electronic system 1100 is a mobile phone, the function unit 1140 may include various components which are capable of executing functions of the mobile phone, for example, a function of dialing, a function of outputting image signals to the display unit 1160 during communication with an external device 1170, and a function of outputting audio signals to speakers during communication with an external device 1170. Further, when the electronic system 1100 includes a camera, the function unit 1140 may correspond to a camera image processor CIP. Moreover, if the electronic system 1100 is connected to a memory card to increase a memory capacity, the function unit 1140 may correspond to a memory card controller. The function unit 1140 may communicate with the external device 1170 through a communication unit 1180 by wireless or cable. Furthermore, in the event that the electronic system 1100 needs a universal serial bus (USB) for function expansion, the function unit 1140 may be an interface controller. The package-on-package devices 100-105 described above may be used in at least one of the microprocessor unit 1120 and the function unit 1140.

Figure 18:
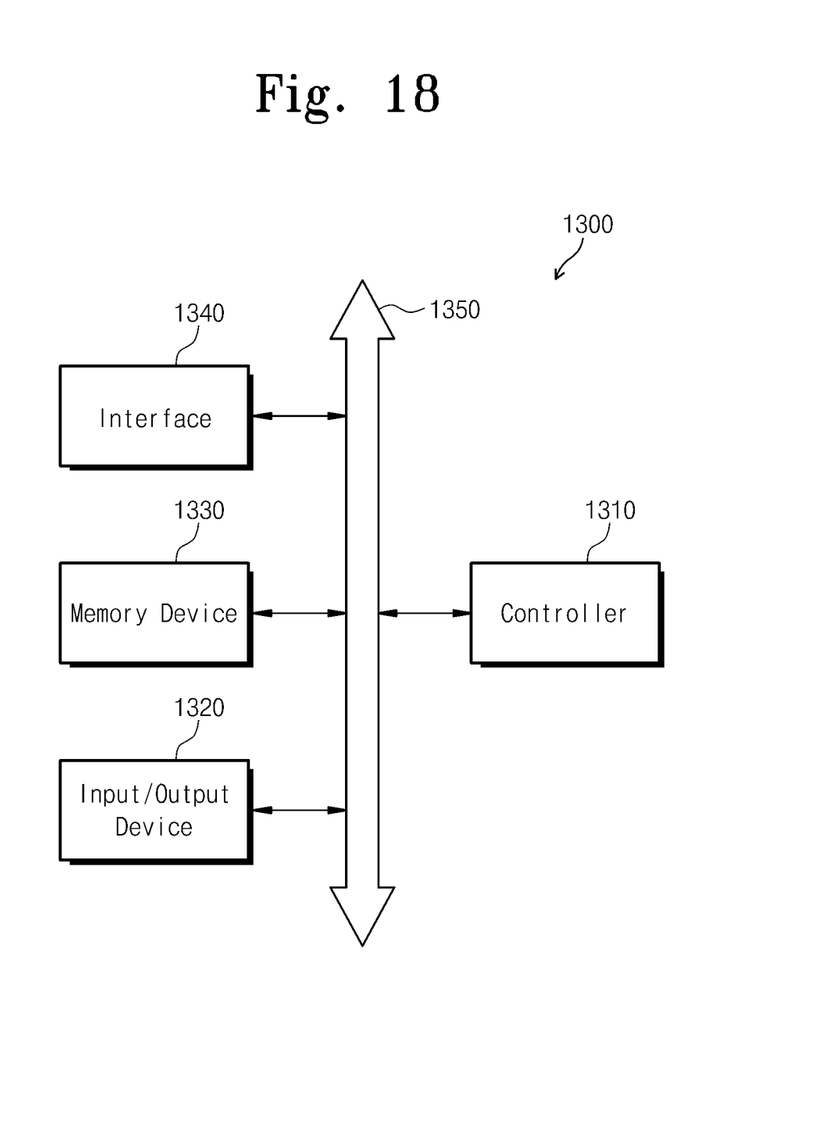
FIG. 18 is a block diagram illustrating an example of electronic systems including semiconductor packages according to various example embodiments of the inventive concepts.

FIG. 18 is a block diagram illustrating an example of electronic systems including semiconductor packages according to various example embodiments of the inventive concepts.

Referring to FIG. 18, an electronic system 1300 according to an embodiment may include a controller 1310, an input/output (I/O) device 1320, a memory device 1330 and a data bus 1350. At least two of the controller 1310, the I/O device 1320 and the memory device 1330 may communicate with each other through the data bus 1350. The data bus 1350 may correspond to a path through which electrical signals are transmitted. The controller 1310 may include at least one of a microprocessor, a digital signal processor, a microcontroller and a logic device. The logic device may have a similar function to any one of the microprocessor, the digital signal processor and the microcontroller. The controller 1310 and/or the memory device 1330 may include at least one of the package-on-package devices described in the above embodiments. The I/O device 1320 may include at least one of a keypad, a keyboard and a display device.

The memory device 1330 may store data and/or commands executed by the controller 1310. The memory device 1330 may include a volatile memory device and/or a nonvolatile memory device. For example, the memory device 1330 may include a flash memory device to which the package techniques according to the embodiments are applied. The flash memory device may constitute a solid state disk (SSD). In this case, the solid state disk including the flash memory device may stably store a large capacity of data. The electronic system 1300 may further include an interface unit 1340. The interface unit 1340 may transmit data to a communication network or may receive data from a communication network. The interface unit 1340 may operate by wireless or cable. For example, the interface unit 1340 may include an antenna for wireless communication or a transceiver for cable communication. Although not shown in the drawings, the electronic system 1300 may further include an application chipset and/or a camera image processor.

According to example embodiments of the inventive concepts, when a solder of a semiconductor device is reflowed, the solder may not flow toward a side surface of a bump, and thus, the solder may not be in contact with a side surface of an anti-wetting layer. Accordingly, it is possible to prevent or inhibit an electric short circuit from occurring between solders adjacent to each other and to control a solder joint. As a result, it is possible to control a fine pitch between the solders and to realize a multi-pin structure.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a bonding pad on a semiconductor substrate;
   a bump on the bonding pad;
   a solder on the bump; and
   an anti-wetting layer between the bump and the solder extending along a sidewall of the bump, the anti-wetting layer in direct contact with the sidewall of the bump and having a first thickness T1 along the sidewall of the bump closer to the solder and a second thickness T2 along the sidewall of the bump closer to the bonding pad, wherein T2<T1.

2. The device of claim 1, wherein an angle between a surface of the bump facing the solder and the sidewall of the bump is about 85-95°.

3. The device of claim 1, wherein the anti-wetting layer covers at least ⅓ of the sidewall of the bump.

4. The device of claim 1, wherein the solder is spaced apart from a sidewall of the anti-wetting layer.

5. The device of claim 1, wherein the anti-wetting layer includes nickel.

6. The device of claim 1, wherein wettability between the anti-wetting layer and the solder is lower than that between the bump and the solder.

7. The device of claim 1, further comprising:
   a semiconductor chip including the semiconductor substrate;
   a package substrate facing the semiconductor chip;
   a conductive pattern on the package substrate, the conductive pattern in contact with the solder; and
   an underfill resin layer filling a region between the semiconductor substrate and the package substrate,
   wherein the underfill resin layer is in contact with the portion of the sidewall of the bump and a portion of the anti-wetting layer on the sidewall of the bump.

8. The device of claim 1, further comprising:
   a seed layer between the bump and the bonding pad,
   wherein the anti-wetting layer is spaced apart from a sidewall of the seed layer.

9. The device of claim 1, wherein
   the anti-wetting layer has a gradient thickness, and
   the thickness is greatest at an endpoint along the sidewall of the bump closest to the solder.

10. A method of fabricating a semiconductor device, comprising:
    forming a seed layer on a semiconductor substrate;
        forming a photoresist pattern including an opening exposing a portion of the seed layer;
        forming a bump to fill a portion of the opening and be in contact with the seed layer;
        partially removing the photoresist pattern to expose an upper portion of a sidewall of the bump;
        forming an anti-wetting layer to cover a top surface of the bump and the upper portion of the sidewall of the bump; and
        forming a first solder to be in contact with a top surface of the anti-wetting layer; and
        removing the photoresist pattern to expose a lower portion of the sidewall of the bump at least after the forming an anti-wetting layer,
    wherein the first solder is spaced apart from a portion of the anti-wetting layer on the sidewall of the bump.

11. The method of claim 10, wherein the partially removing the photoresist pattern comprises performing a descum process.

12. The method of claim 10, further comprising:
    removing a portion of the seed layer not covered by the bump; and
    reflowing the first solder to transform the first solder into a spherical shape.

13. The method of claim 12, further comprising:
    providing a flux agent on a bottom surface of the first solder;
    providing a package substrate including,
        a conductive pattern on a top surface thereof, and
        a second solder in contact with the conductive pattern and the first solder; and
    welding the first and second solders together.

14. The method of claim 10, wherein the forming an anti-wetting layer forms the anti-wetting layer to have a gradient thickness, the thickness being greatest at an endpoint along the sidewall of the bump closest to the solder.

15. The method of claim 11, wherein the performing a descum process includes using nitrogen plasma.

16. The method of claim 11, wherein the performing a descum process partially removes the photoresist pattern without etching the bump.

17. A semiconductor device comprising:
    a semiconductor substrate including a bonding pad;
    a package substrate including a conductive pattern;
    a connection structure connecting the bonding pad with the conductive pad, the connection structure including,
        a bump on the bonding pad, and
        a solder on the conductive pattern;
    an anti-wetting layer between the bump and the solder and extending to cover at least a portion of the sidewall of the bump; and
    an underfill resin layer filling a region between the semiconductor substrate and the package substrate,
    wherein the underfill resin layer is in contact with a portion of the anti-wetting layer on the portion of the sidewall of the bump.

18. The device of claim 17, wherein the anti-wetting layer has a first thickness T1 along the sidewall of the bump closer to the solder and a second thickness T2 along the sidewall of the bump further from the solder, wherein T2<T1.

19. The device of claim 17, wherein an angle between the surface of the bump facing the solder and the sidewall of the bump is about 85-95°.

20. The device of claim 17, wherein the anti-wetting layer covers at least ⅓ of the sidewall of the bump.

21. The device of claim 17, wherein the anti-wetting layer includes nickel.

22. The device of claim 17, wherein the solder includes at least one of silver, tin, and lead.

23. The device of claim 17, wherein
    the anti-wetting layer has a gradient thickness, and
    the thickness is greatest at an endpoint along the sidewall of the bump closest to the solder.

* * * * *